(12) United States Patent
Kim (10) Patent No.: US 7,951,667 B2
(45) Date of Patent: May 31, 2011

(54) METHOD FOR FABRICATING SEMICONDUCTOR DEVICE

(75) Inventor: Jin Soo Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 10 days.

(21) Appl. No.: 12/329,148

(22) Filed: Dec. 5, 2008

(65) Prior Publication Data

US 2009/0258467 A1   Oct. 15, 2009

(30) Foreign Application Priority Data

Apr. 10, 2008   (KR) .................. 10-2008-0033114

(51) Int. Cl.
*H01L 21/8242* (2006.01)

(52) U.S. Cl. ........ 438/253; 438/256; 438/268; 438/270; 257/E21.645

(58) Field of Classification Search .................. 438/268, 438/270, 253, 256; 257/E21.645
See application file for complete search history.

(56) References Cited

U.S. PATENT DOCUMENTS

| | | | | |
|---|---|---|---|---|
| 5,828,094 A * | 10/1998 | Lee | ................. | 257/296 |
| 7,348,628 B2 * | 3/2008 | Yoon et al. | ................. | 257/328 |
| 7,531,412 B2 | 5/2009 | Yoon et al. | | |
| 2006/0261393 A1 * | 11/2006 | Tang et al. | ................. | 257/296 |
| 2007/0082448 A1 * | 4/2007 | Kim et al. | ................. | 438/268 |
| 2007/0190766 A1 * | 8/2007 | Seo et al. | ................. | 438/585 |
| 2008/0064212 A1 * | 3/2008 | Ogawa et al. | ................. | 438/694 |

FOREIGN PATENT DOCUMENTS

| KR | 100147584 B1 | 5/1998 |
|---|---|---|
| KR | 100734313 B1 | 6/2007 |

* cited by examiner

*Primary Examiner* — Michael Trinh
(74) *Attorney, Agent, or Firm* — Kilpatrick Townsend & Stockton LLP (57) ABSTRACT

A method of fabricating a vertical transistor in a semiconductor device improves integration of the semiconductor device according to a design rule. After a semiconductor substrate is etched to form a buried bit line, a gate electrode pattern that surrounds a cylindrical channel region pattern of the vertical transistor is formed, thereby preventing damage to the gate electrode pattern due to an etching process. The gate electrode pattern surrounds the channel region pattern where a width is narrower than second source and drain regions. The second source and drain regions are then deposited over the channel region pattern and the gate electrode pattern. As a result, a neck-shaped channel region does not collapse due to the weight of the second source and drain regions.

17 Claims, 6 Drawing Sheets

METHOD FOR FABRICATING SEMICONDUCTOR DEVICE

CROSS-REFERENCES TO RELATED APPLICATIONS

Priority is claimed to Korean patent application number 10-2008-0033114, filed on Apr. 10, 2008, which is incorporated by reference in its entirety.

BACKGROUND OF THE INVENTION

The present invention generally relates to a method of fabricating a high integrated semiconductor device, and more specifically, to a method of fabricating a vertical transistor that improves integration of the semiconductor device according to a design rule.

Generally, a semiconductor comprises material that does not always conduct electricity and is not completely isolative. Although the semiconductor is similar to a nonconductor in a pure state, the addition of impurities or other manipulation can increase the electric conductivity of the semiconductor. Impurities are added to the semiconductor, which is then connected to a conductor to create a semiconductor device such as a transistor. A semiconductor device refers to an apparatus having various semiconductor functions. A semiconductor memory device is a representative example of a semiconductor device.

A type of semiconductor memory device includes a plurality of unit cells each including a capacitor and a transistor. A double capacitor has been used to temporarily store data. A transistor has been used to transmit data between a bit line and a capacitor corresponding to a control signal (word line) using the electric conductivity of the semiconductor that changes depending on environment. The transistor has three regions including a gate, a source and a drain. Charges between the source and drain move in response to a control signal input to the gate. The charges between the source and the drain move through a channel region in accordance with the properties of the semiconductor.

When a transistor is formed in a semiconductor substrate, a gate is formed in the semiconductor substrate, and impurities are doped at both sides of the gate to form a source and a drain. In this case, the space between the drain and the source below the gate is a channel region of the transistor. The transistor having a horizontal channel region occupies the semiconductor substrate with a given area. In the case of a complicated semiconductor device, it is difficult to reduce the occupied area due to a plurality of transistors included in the semiconductor device.

If the area of the semiconductor device is reduced, the total number semiconductor device that can be produced per wafer is increased to improve productivity. Several methods have been suggested to reduce the area of the semiconductor device. One method uses a three-dimensional transistor which includes a vertical transistor having a vertical channel region instead of a conventional horizontal transistor having a horizontal channel region.

FIGS. 1a to 1d are cross-sectional diagrams illustrating a method of fabricating a gate pattern of a vertical transistor in a general semiconductor device.

Figure 1A:
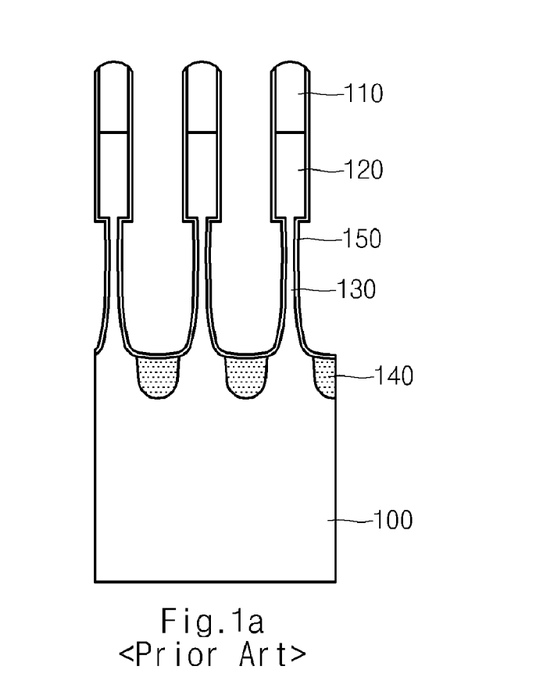
FIGS. 1a to 1d are cross-sectional diagrams illustrating a method of fabricating a gate pattern of a vertical transistor in a general semiconductor device.

Referring to FIG. 1a, a semiconductor substrate 100 is etched with a gate pattern mask 110 to form a cylinder-type pattern. A wet etching process is performed to etch a bottom of the cylinder-type pattern, thereby obtaining a neck-shaped portion. A top portion of the cylinder-type pattern is used as a first source and drain regions 120, and a bottom portion 130 of the cylinder-type pattern is used as a neck-shaped channel region. Impurities are ion-implanted to form an active region 140 used as a second source and drain regions. The exposed semiconductor substrate is oxidized to form a gate oxide film 150.

Figure 1B:
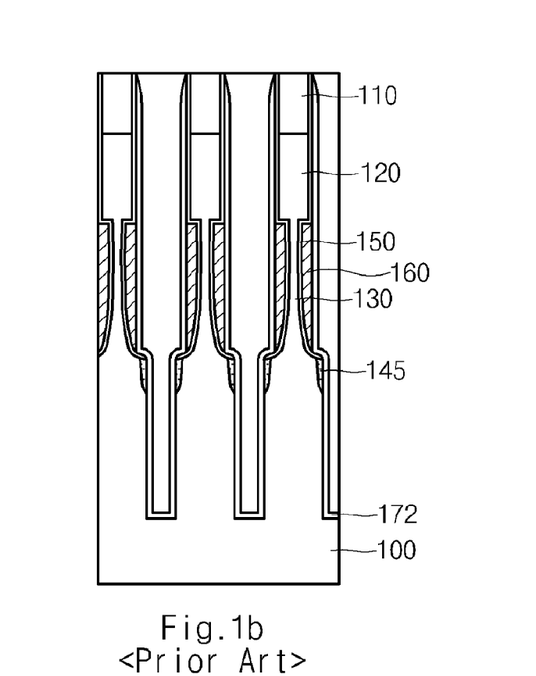

As shown in FIG. 1b, after a gate electrode 160 is deposited to surround the bottom portion 130 of the cylinder-type pattern, the resulting structure is etched to expose the active region 140 and the semiconductor substrate 100 located below the active region 140, thereby obtaining a buried bit line 145. After isolating neighboring gate patterns arranged in direction of word line from each other through etching process, a pad oxide film 172 is formed on the exposed semiconductor substrate 100, exposed sidewall of the buried bit line 145, and exposed surface of the gate pattern including the gate pattern mask 110, the first source and drain regions 120, and the gate electrode 160.

Figure 1C:
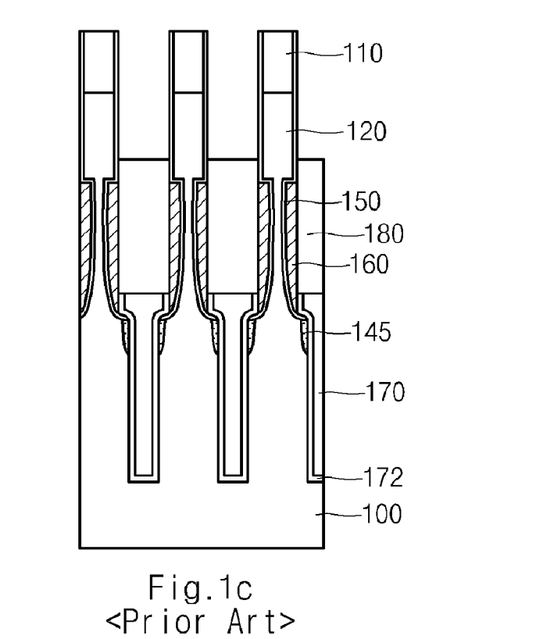
Figure 1D:
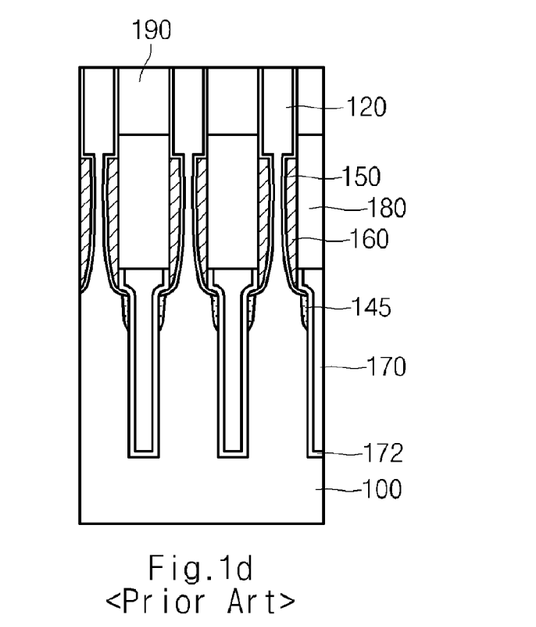

As shown in FIG. 1c, a first insulating film 170 is filled between facing buried bit lines 145, and a damascene word line 180 for connecting the gate electrodes 160 is formed over the first insulating film 170 through a damascene process. As shown in FIG. 1d, after a second insulating film 190 is deposited over the damascene word line 180, a chemical mechanical polishing (CMP) process is performed to expose the top portion of the cylinder-type pattern that is used as the first source and drain regions 120.

Figure 2A:
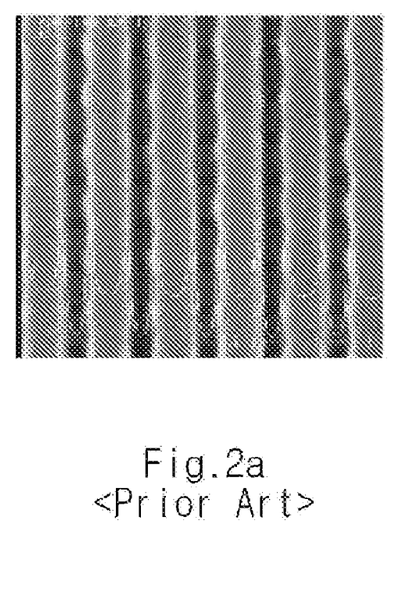
FIGS. 2a and 2b are photographs illustrating problems generated when the vertical transistor of FIGS. 1a to 1d is fabricated.
Figure 2B:
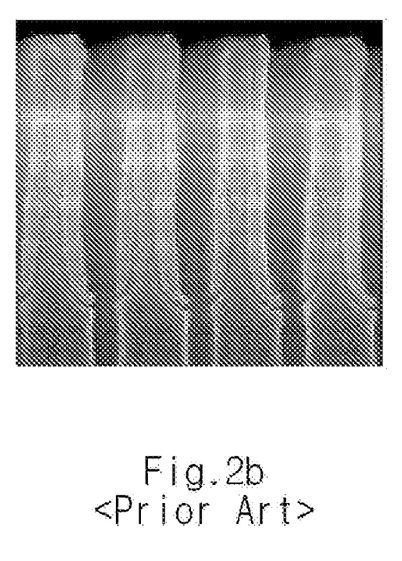

FIGS. 2a and 2b are scanning acoustic microscope (SAM) photograph diagrams illustrating problems generated when the vertical transistor of FIGS. 1a to 1d are fabricated. Specifically, FIG. 2a is a plane diagram that shows a vertical transistor, and FIG. 2b is a cross-sectional diagram that shows a vertical transistor.

Referring to FIG. 2b, each vertical transistor is covered with a photoresist pattern for an etching process to form the buried bit line 145. However, a portion of the gate electrode 160 is exposed by the photoresist pattern due to misalignment when the gate electrode 160 of the vertical transistor is formed, so that a surface between the photoresist patterns is uneven. When the process margin is sufficient, the uneven surface does not affect the patterns of the transistor including the first source and drain regions 120 or the gate electrode 160 of each vertical transistor. However, since the process margin is not sufficient due to a reduction of the design rule, when an etching process is performed with the photoresist pattern, as shown in FIG. 2b, the shapes of the gate oxide film 150, the gate electrode 160 and the first source and drain regions 120 change. In this case, it is difficult to secure a normal operation of the vertical transistor.

Before the gate electrode 160 is formed, the semiconductor substrate 100 is etched, and the bottom portion 130 of the cylinder-type pattern is further etched to form a neck portion. As a result, the bottom portion 130 of the cylinder-type pattern is narrower than the top portion of the cylinder-type pattern, so that the pattern may collapse. As the design rule becomes smaller, the vertical transistor has a lower aspect ratio.

The integration of the semiconductor device has increased, and the design rule has been reduced. As a result, the aspect ratio of the vertical transistor fabricated based on the cylinder-type pattern obtained by etching the semiconductor substrate 100 has been reduced continuously. However, when the vertical transistor in the semiconductor device is fabricated by the above-described method, mis-alignment or limits due to an etching characteristic are generated while the buried bit line 145 is etched narrowly and deeply. Also, the pattern of the vertical transistor is over-etched, so that a portion of the gate oxide film 130, the gate electrode 160 and the first source and drain regions 120 may be damaged. Moreover, patterns may collapse after the etching process to form a neck portion in the bottom portion 130 of the cylinder-type pattern. As a result, the yield of the manufacturing process may be deteriorated, productivity may be degraded, and manufacturing costs may increase.

BRIEF SUMMARY OF THE INVENTION

Various embodiments of the present invention are directed at providing a method of fabricating a vertical transistor in a semiconductor device to prevent a cylindrical silicon pattern from collapsing due to a neck portion located at a bottom of the silicon pattern and to prevent a gate electrode from being etched due to misalignment.

According to an embodiment of the present invention, a method of fabricating a semiconductor device comprises: etching a semiconductor substrate to form a pillar-type channel region pattern; forming a buried bit line in a bottom of the channel region pattern; forming a gate electrode pattern that surrounds the channel region pattern; forming a word line that connects to the gate electrode pattern; and forming a storage node over the channel region pattern and the gate electrode pattern.

The method further comprises forming a gate oxide film over the semiconductor substrate and the channel region pattern.

The forming-a-buried-bit-line includes: ion-implanting impurities into the bottom of the channel region; etching the semiconductor substrate exposed between the channel regions using a buried bit line mask; and forming an interlayer insulating film over the etched semiconductor substrate.

The forming-the-interlayer-insulating-film includes: forming an oxide film on sidewalls of the etched semiconductor substrate; depositing the interlayer insulating film; and performing a chemical mechanical polishing (CMP) process to expose a top surface of the channel region.

The forming-the-interlayer-insulating-film includes performing an annealing process before the CMP process to stabilize the interlayer insulating film.

The forming-the-gate-electrode-pattern includes: etching the interlayer insulating film with a gate electrode pattern mask to secure a gate region; depositing a gate electrode material; and performing a CMP process to expose the top surface of the channel region.

The gate electrode pattern mask exposes a region including an exposed region of a channel region pattern mask that is used to etch the semiconductor substrate to form the channel region.

The forming-a-word-line includes: etching the interlayer insulating film exposed by a word line mask; depositing a word line material; and performing a CMP process to expose the top surface of the channel region.

The forming-a-storage-node includes: depositing an interlayer insulating film; etching the interlayer insulating film using a gate electrode pattern mask; forming a gate oxide film in the etched region; and depositing silicon over the gate oxide film by an epitaxy process.

According to an embodiment of the present invention, a method of fabricating a vertical transistor comprises: forming a pillar-type channel region; forming a first active region in a bottom of the channel region; forming a gate oxide film on sidewalls and a top surface of the channel region; forming a gate electrode that surrounds the sidewalls of the channel region; and forming a second active region over the channel region and the gate electrode.

The pillar-type channel region is formed by etching the semiconductor substrate using a channel mask.

The method further comprises etching the semiconductor substrate to form a first interlayer insulating film that is isolated from an adjacent vertical transistor.

The gate electrode is formed by filling a gate electrode material in a region formed by etching the first interlayer insulating film that surrounds the channel region using a gate mask.

The forming-a-second-active-region includes: forming a second interlayer insulating film after forming the gate electrode; etching the second interlayer insulating film using the gate mask; forming the gate oxide film over the exposed channel region and the gate electrode; and depositing silicon over the channel region and the gate electrode.

The silicon is deposited by an epitaxy process.

According to an embodiment of the present invention, a method of fabricating a semiconductor device comprises: forming cylindrical channel regions in a semiconductor substrate; forming an active region in a bottom portion of each channel region; forming a gate electrode pattern that surrounds upper sidewalls of each channel region; forming a word line between the gate electrode patterns of adjacent channel regions, wherein the word line connects to the gate electrode patterns; and forming a storage node over each channel region and the corresponding gate electrode pattern.

DESCRIPTION OF EMBODIMENTS

FIGS. 3a to 3f are cross-sectional diagrams illustrating a method of fabricating a vertical transistor in a semiconductor device according to an embodiment of the present invention.

Referring to FIGS. 3a to 3f, a vertical transistor is fabricated as a cell transistor included in each unit cell of a semiconductor device. In one embodiment of the present invention, a method of fabricating a semiconductor device comprises: etching a semiconductor substrate 300 to form a pillar-type channel region pattern; forming a buried bit line 345 in a bottom of the channel region pattern; forming a gate electrode pattern 360 that surrounds the channel region pattern; forming a word line 380 that connects to the gate electrode pattern 360; and forming a storage node 320 over the channel region pattern and the gate electrode pattern 360.

Figure 3A:
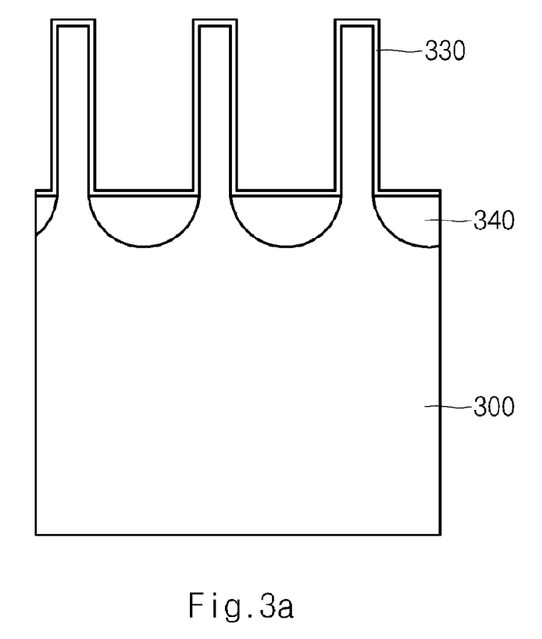
FIGS. 3a to 3f are cross-sectional diagrams illustrating a method of fabricating a vertical transistor in a semiconductor device according to an embodiment of the present invention.

Specifically, referring to FIG. 3a, the semiconductor substrate 300 is etched using a channel region pattern mask (not shown) to form the pillar-type channel region pattern. Impurities are ion-implanted into a bottom of the pillar-type channel region pattern to form an active region 340 corresponding to source and drain regions located at one side of the vertical transistor. The semiconductor substrate 300 including a channel region is oxidized to form a gate oxide film 330.

Figure 3B:
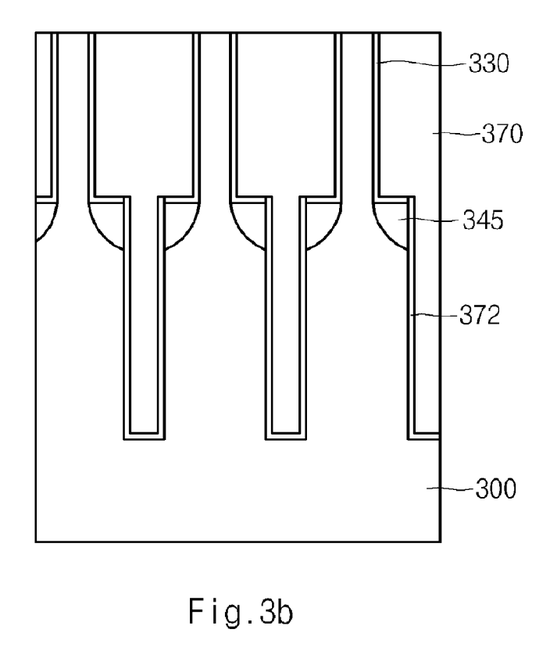

After the gate oxide film 330 is formed, the semiconductor substrate 300 between the channel regions is etched as shown in FIG. 3b. A portion of the semiconductor substrate 300 between the channel region patterns where a buried bit line 345 is formed is not etched; however, a portion of the semiconductor substrate 300 between the channel region patterns in the direction of a word line is etched to isolate an active region of an adjacent vertical transistor. As shown in FIG. 3b, the active region corresponding to each channel region pattern is separated from each other to form a pair of buried bit lines 345. A pad oxide film 372 is formed on the exposed semiconductor substrate 300 and exposed sidewall of the buried bit line 345, and a first interlayer insulating film 370 is deposited on the pad oxide film 372 to fill a space between the channel region patterns.

After the first interlayer insulating film 370 is deposited, an annealing process is performed to stabilize the material. A chemical mechanical polishing (CMP) process is then performed to expose a top surface of the channel region patterns. An additional annealing process may be performed to stabilize the material deposited with an interlayer insulating film.

Figure 3C:
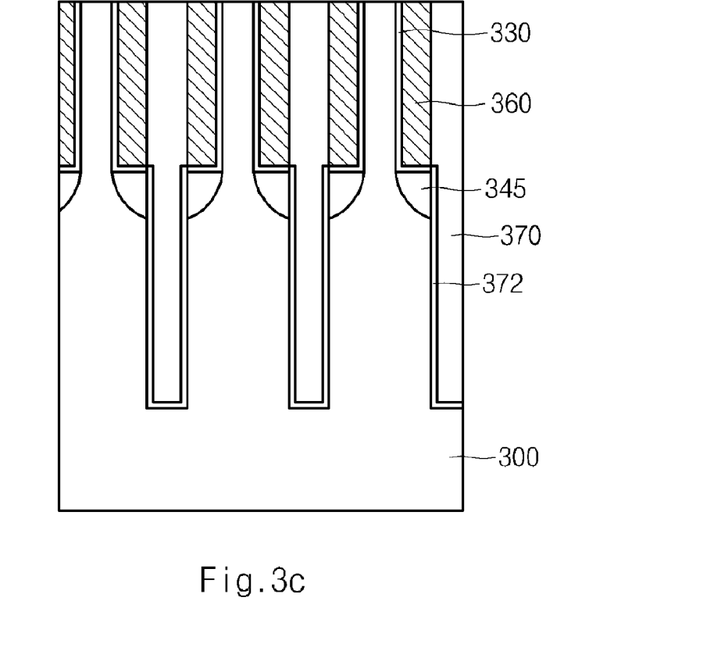

As shown in FIG. 3c, a given range around the channel region pattern is etched using a gate electrode pattern mask (not shown) to secure a space for forming a gate electrode. The gate electrode pattern mask exposes a region including an exposed region of a channel region pattern mask (not shown) that is used when the semiconductor substrate 300 is etched to form a channel region pattern. An etching process is performed with an adjustable etching selectivity so that the exposed channel region pattern is not etched but the exposed first interlayer insulating film 370 is etched. A CMP process is performed until a gate electrode material is filled in the etched space and the top surface of the channel region pattern is exposed, thereby obtaining a gate electrode pattern 360.

Figure 3D:
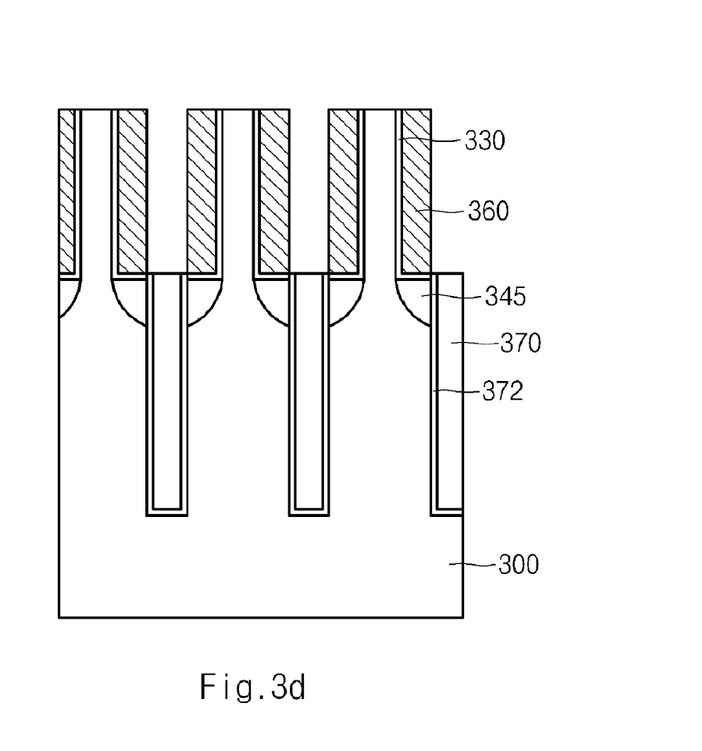

As shown in FIG. 3d, the first interlayer insulating film 370 between adjacent gate electrode patterns 360 is etched using a word line mask (not shown). The etching process is performed not toward a bit line direction but toward a word line direction, unlike when the buried bit line 345 is formed.

Figure 3E:
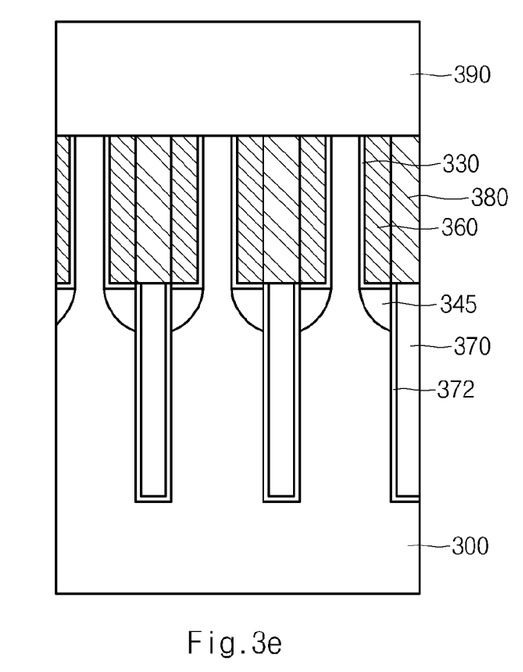

As shown in FIG. 3e, a word line 380 is formed in the etched space above the remaining first interlayer insulating film 370. After the word line 380 is formed, a CMP process is performed to expose the top surface of the channel region pattern. A second interlayer insulating film 390 is formed with a given thickness over the planarized resulting surface.

Figure 3F:
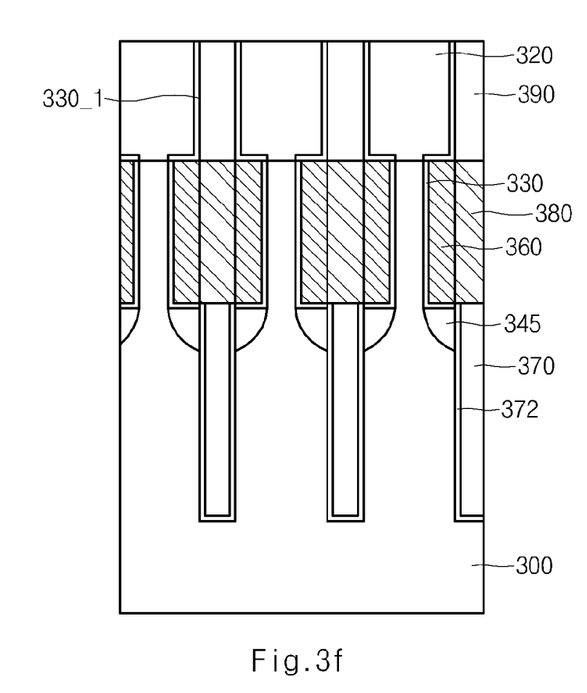

Referring to FIG. 3f, after the second interlayer insulating film 390 is deposited, the gate electrode pattern 360 and the second interlayer insulating film 390 that remains over the channel region pattern are etched using the gate electrode pattern mask (not shown) used in FIG. 3c. The exposed gate electrode pattern 360 and the exposed second interlayer insulating film 390 are oxidized to form a gate oxide film 330_1. An epitaxy process is performed to deposit silicon over the gate oxide film 330_1 over the channel pattern region between the second interlayer insulating film 390, thereby obtaining second source and drain regions 320 of the vertical transistor. In the case of a semiconductor device, the second source and drain regions 320, which correspond to a storage node in each unit cell, facilitates formation of a capacitor (not shown) connected to the second source and drain regions 320 in a subsequent process.

As mentioned above, according to an embodiment of the present invention, after the semiconductor substrate 300 is etched to form a buried bit line, the gate electrode pattern 360 that surrounds a channel region of the vertical transistor corresponding to a conventional neck portion is formed, thereby preventing damage of the gate electrode pattern 360 due to an etching process.

Also, after the gate electrode pattern 360 is formed that surrounds the pillar-type channel region pattern where a width is narrower than the second source and drain regions 320, the second source and drain regions 320 are deposited over the channel region pattern and the gate electrode pattern 360. As a result, a neck-shaped channel region does not collapse due to the weight of the second source and drain regions 320, like in the conventional art.

Furthermore, the vertical transistor does not collapse, and the gate electrode pattern is not damaged in the method of fabricating a semiconductor device according to an embodiment of the present invention. As a result, it is easy to control overlay, such as misalignment, and to secure a process margin including the size of each pattern, thereby improving productivity.

As described above, according to an embodiment of the present invention, a method of fabricating a vertical transistor includes forming a pillar-type channel region, forming a first active region in a bottom of the channel region, forming a gate oxide film on sidewalls and a top surface of the channel region, forming a gate electrode that surrounds the sidewalls of the channel region, and forming a second active region over the channel region and the gate electrode. The pillar shape of the channel region is generally configured to be cylindrical in order to increase integration while securing a minimum separation distance from the neighboring channel region, but can be changed depending on a mask pattern.

The above embodiments of the present invention are illustrative and not limitative. Various alternatives and equivalents are possible. The invention is not limited by the type of deposition, etching, polishing, and patterning steps describe herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method of fabricating a semiconductor device, the method comprising:
    etching a semiconductor substrate to form a pillar-type channel region pattern;
    forming a buried bit line in a bottom of the channel region pattern;
    forming a gate electrode pattern that surrounds the channel region pattern;
    forming a word line that connects to the gate electrode pattern;
    forming a second interlayer insulating film on the word line, the gate electrode pattern, and the channel region pattern;
    etching the second interlayer insulating film using a gate electrode pattern mask;
    forming a second gate oxide film in the etched region of the second interlayer insulating film; and
    performing an epitaxy process to form a storage node over the channel region pattern and the gate electrode pattern.

2. The method according to claim 1, further comprising forming a first gate oxide film over the semiconductor substrate and the channel region pattern.

3. The method according to claim 1, wherein the forming a buried bit line includes:
    ion-implanting impurities into the bottom of the channel region pattern;
    etching the semiconductor substrate exposed between the channel region patterns using a buried bit line mask; and
    forming a first interlayer insulating film over the etched semiconductor substrate.

4. The method according to claim 3, wherein the forming a first interlayer insulating film includes:
   forming an oxide film on sidewalls of the etched semiconductor substrate;
   depositing the first interlayer insulating film; and
   performing a chemical mechanical polishing (CMP) process to expose a top surface of the channel region pattern.

5. The method according to claim 4, wherein the forming a first interlayer insulating film includes performing an annealing process before the CMP process to stabilize the first interlayer insulating film.

6. The method according to claim 3, wherein the forming a gate electrode pattern includes:
   etching the first interlayer insulating film using a gate electrode pattern mask to secure a gate region;
   depositing a gate electrode material; and
   performing a CMP process to expose a top surface of the channel region pattern.

7. The method according to claim 6, wherein the gate electrode pattern mask exposes a region including an exposed region of a channel region pattern mask that is used to etch the semiconductor substrate to form the channel region pattern.

8. The method according to claim 3, wherein the forming a word line includes:
   etching the first interlayer insulating film exposed by a word line mask;
   depositing a word line material; and
   performing a CMP process to expose a top surface of the channel region pattern.

9. A method of fabricating a vertical transistor, the method comprising:
   forming a pillar-type channel region;
   forming a first active region in a bottom of the channel region;
   forming a first gate oxide film on sidewalls and a top surface of the channel region;
   forming a gate electrode that surrounds the sidewalls of the channel region;
   forming a second interlayer insulating film on the gate electrode and the channel region;
   etching the second interlayer insulating film using a gate mask;
   forming a second gate oxide film over the exposed channel region and the gate electrode; and
   depositing silicon over the channel region and the gate electrode by an epitaxy process to form a second active region.

10. The method according to claim 9, wherein the pillar-type channel region is formed by etching the semiconductor substrate using a channel mask.

11. The method according to claim 9, further comprising forming a first interlayer insulating film in a region formed by etching the semiconductor substrate so as to separate a vertical transistor from an adjacent vertical transistor.

12. The method according to claim 11, wherein the gate electrode is formed by filling a gate electrode material in a region formed by etching the first interlayer insulating film that surrounds the channel region using a gate mask.

13. A method of fabricating a semiconductor device, the method comprising:
   forming cylindrical channel regions in a semiconductor substrate;
   forming an active region in a bottom portion of each channel region;
   forming a gate electrode pattern that surrounds upper sidewalls of each channel region;
   forming a word line between the gate electrode patterns of adjacent channel regions, wherein the word line connects to the gate electrode patterns;
   forming a second interlayer insulating film on the word line, the gate electrode patterns, and the channel regions;
   etching the second interlayer insulating film using a gate electrode pattern mask;
   forming a second gate oxide film in the etched region of the second interlayer insulating film; and
   performing an epitaxy process to form a storage node over each channel region and the corresponding gate electrode pattern.

14. The method according to claim 13, further comprising forming a first gate oxide film over the semiconductor substrate and the channel region.

15. The method according to claim 13, wherein the forming an active region includes:
   ion-implanting impurities into the bottom portion of each channel region;
   etching the semiconductor substrate exposed between the channel regions; and
   forming a first interlayer insulating film over the etched semiconductor substrate.

16. The method according to claim 15, wherein the forming a gate electrode pattern includes :
   etching the first interlayer insulating film using a gate electrode pattern mask to secure gate regions;
   depositing a gate electrode material; and
   performing a CMP process to expose a top surface of each channel region.

17. The method according to claim 15, wherein the forming a word line includes:
   etching the first interlayer insulating film exposed by a word line mask;
   depositing a word line material; and
   performing a CMP process to expose a top surface of the channel regions.

* * * * *